United States Patent [19]
Yokoyama et al.

[11] Patent Number: 5,972,543
[45] Date of Patent: Oct. 26, 1999

[54] PHASE SHIFT MASK AND METHOD OF PRODUCING THE SAME

[75] Inventors: Toshifumi Yokoyama; Koichi Mikami; Chiaki Hatsuda; Hiroshi Mohri, all of Tokyo, Japan

[73] Assignee: Dai Nippon Printing Co., Ltd., Tokyo, Japan

[21] Appl. No.: 09/100,083

[22] Filed: Jun. 19, 1998

Related U.S. Application Data

[62] Division of application No. 08/691,369, Aug. 2, 1996, Pat. No. 5,811,208.

[30] Foreign Application Priority Data

| Aug. 4, 1995 | [JP] | Japan | 7-199688 |
| Aug. 4, 1995 | [JP] | Japan | 7-199689 |
| Aug. 4, 1995 | [JP] | Japan | 7-199690 |

[51] Int. Cl.$^6$ .................................................. G03F 9/00
[52] U.S. Cl. ................................................................ 430/5
[58] Field of Search ........................... 430/5, 322, 324

[56] References Cited

U.S. PATENT DOCUMENTS

| 5,424,153 | 6/1995 | Asai ............................................ 430/5 |
| 5,429,896 | 7/1995 | Hasegawa et al. . |
| 5,527,647 | 6/1996 | Doi et al. . |

*Primary Examiner*—S. Rosasco
*Attorney, Agent, or Firm*—Sughrue, Mion, Zinn, Macpeak & Seas, PLLC

[57] ABSTRACT

A phase shift mask, e.g. a halftone phase shift mask, which need not to form an ultra-fine pattern and is capable of suppressing during exposure the occurrence of a sub-peak of light intensity, which has an adverse effect on the image formation, and which has a light-blocking pattern with a reduced transmittance at a region outside a device pattern area which corresponds to a region subjected to multiple exposure during transfer effected by using the mask. The halftone phase shift mask has on a transparent substrate (101) a halftone phase shift film (102) comprising a single layer or a plurality of layers. The composition of the halftone phase shift film (102) is changed in a region (107) outside a device pattern area on the transparent substrate (101) which corresponds to a multiple-exposure region by a method wherein the region (107) is irradiated with an electromagnetic wave, a particle beam, heat rays, etc., or a method wherein after a region in which the composition is not desired to change has been masked, the whole blank is exposed to an active atmosphere, thereby reducing the transmittance for exposure light at the region (107).

2 Claims, 16 Drawing Sheets

FIG. 10(a)
FIG. 10(b)
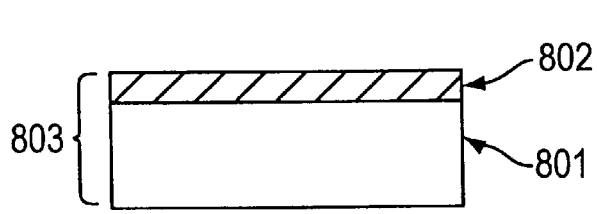
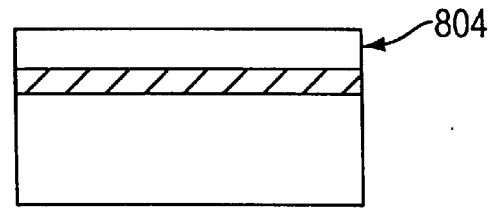
FIG. 10(c)
FIG. 10(d)
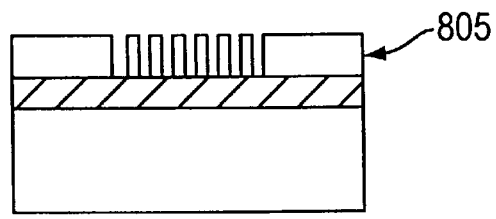
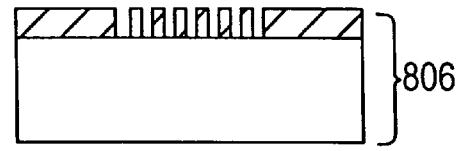
FIG. 10(e)
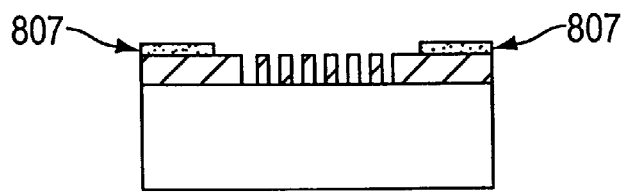

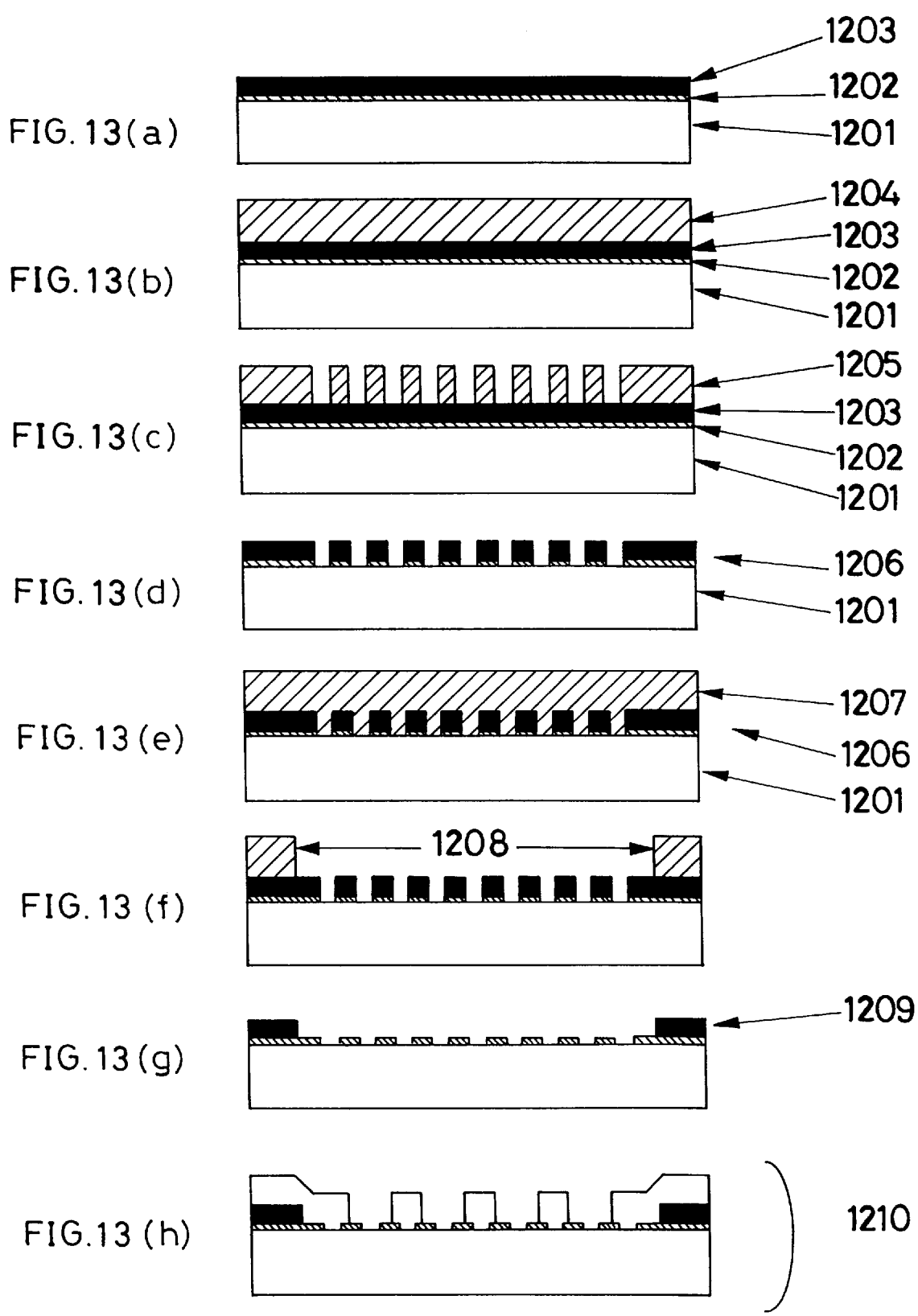

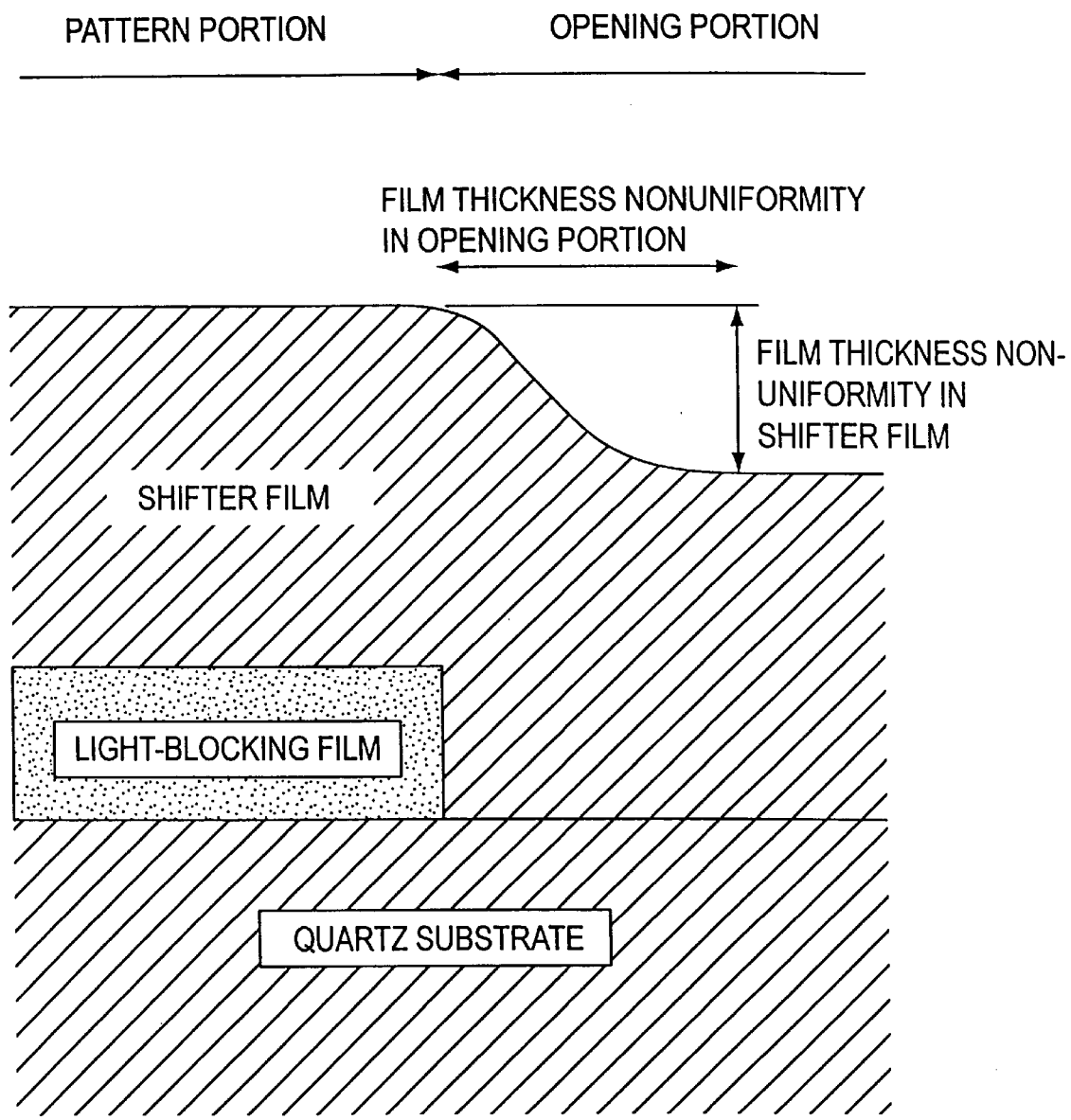

PHASE SHIFT MASK AND METHOD OF PRODUCING THE SAME

This is a divisional of Application No. 08/691,369 filed Aug. 2, 1996, the disclosure of which is incorporated herein by reference.

BACKGROUND OF THE INVENTION

The present invention relates to a phase shift mask and a method of producing the same. More particularly, the present invention relates to a phase shift mask which is used to produce VLSI (Very Large Scale Integrated) circuits, and which is easy to produce and capable of forming fine-line line patterns. The present invention also relates to a method of producing such a phase shift mask.

As one type of phase shift mask, a halftone phase shift mask is known. The halftone phase shift mask is useful to form fine-line patterns, but suffers from two problems as stated below:

(1) During transfer, a sub-peak of light intensity appears in the vicinity of a pattern which is desired to be formed on a wafer by exposure, causing the exposed pattern to be undesirably deformed. This problem is particularly seen in the vicinity of a large open pattern. For a large open pattern which can be satisfactorily resolved without using the phase shift lithography technique, the halftone phase shift mask is inferior to a conventional chromium mask in terms of transfer characteristics.

(2) When transfer exposure is sequentially carried out on a wafer by using a stepper, a multiple-exposure region occurs on the wafer in which adjacent shots (each of which is an area where pattern transfer is effected by a single exposure operation) overlap each other. When it is desired to prevent the multiple-exposure region from being undesirably exposed to exposure light, in the case of the conventional chromium mask, the peripheral portion of the mask is formed as a masking pattern (black pattern) portion. By doing so, exposure light is completely blocked at the peripheral portion of the mask, and thus the multiple-exposure region is prevented from being undesirably exposed. However, in the case of the halftone phase shift mask, the masking pattern portion is also translucent. Therefore, the multiple-exposure region is undesirably exposed to exposure light by being repeatedly subjected to multiple exposure.

In other words, the halftone phase shift mask indispensably needs to impart light-blocking properties to some region on its substrate from a practical point of view. Accordingly, either of the following two methods has heretofore been adopted:

(A) A method in which an ultra-fine repeated pattern, which is finer than the resolution limit, is disposed at a mask region where practically no exposure light should pass (see Japanese Patent Application Unexamined Publication (KOKAI) No. 6-175347).

(B) A method in which a halftone phase shift film and a light-blocking film or a film capable of providing a high contrast are stacked, and after the whole stack structure has been processed into a predetermined pattern, the light-blocking film or the film capable of providing a high contrast is processed into a necessary pattern.

There are other types of conventional phase shift masks, e.g. a LEVENSON type phase shift mask, in which a mask has on a transparent substrate at least a light-blocking film for forming a first pattern and a phase shift film for forming a second pattern. Such phase shift masks are known to be useful for forming fine-line patterns. As phase shift masks of this sort, the following two types are generally known:

(i) An overlying shifter type phase shift mask which is obtained by a process in which a light-blocking film is provided on the whole surface of a transparent substrate, and after the light-blocking film has been formed into a predetermined pattern by a photoengraving process, a phase shift film is provided on the whole surface and subjected to a photoengraving process.

(ii) An underlying shifter type phase shift mask which is obtained by a process in which, after a phase shift film and a light-blocking film have been provided in the mentioned order on the whole surface of a transparent substrate, the light-blocking film is processed into a predetermined pattern, and then the phase shift film is patterned.

A comparison between the two types of phase shift mask reveals that the former is more advantageous than the latter for the following reasons:

(1) In the latter, a so-called optical waveguide effect is produced, and a complicated pattern data adjustment is required to cancel it. However, the former needs no pattern data adjustment.

(2) In the former, a process concerning the phase shift film, which is a process unique to a phase shift mask, can be additionally carried out after the conventional chromium mask process, whereas, in the latter the phase shift film process must be carried out during the chromium mask process. Accordingly, the former can use the conventional light-blocking film process without any change, whereas the latter necessitates reviewing a part of the light-blocking film process because of the presence of the phase shift film.

Incidentally, the above-described solution (A) for halftone phase shift masks has the advantage that a mask can be produced by a single lithography process. However, since the above-described repeated pattern must be exceedingly fine, it is extremely difficult to fabricate.

In the case of the solution (B), the pattern formation is easy, but it is essentially necessary to carry out photoengraving twice. Therefore, the process undesirably lengthens.

Among the LEVENSON and other similar types of phase shift mask, the overlying shifter type phase shift mask also suffers from the following disadvantages: When a phase shift film is formed over a patterned light-blocking film, the phase shift film cannot uniformly be formed by the influence of steps in the light-blocking film. Nonuniformity in the thickness of the phase shift film causes the amount of phase shift given to exposure light passing through the film to become nonuniform, thus markedly degrading the performance of the phase shift mask.

In order to eliminate nonuniformity in the thickness of the phase shift film and to obtain a phase shift mask having an accurately controlled phase angle, it is necessary to reduce the thickness of the light-blocking film and to minimize steps in the light-blocking film. However, if the thickness of the light-blocking film is reduced, the light-blocking performance of the film is degraded, and when step-and-repeat exposure is carried out, a multiple-exposure region, in which adjacent shots (each of which is an area where pattern transfer is effected by a single exposure operation) overlap each other, is undesirably exposed to exposure light, causing the contrast to be undesirably reduced. Therefore, it is difficult to solve the above-described problem by reducing the thickness of the light-blocking film.

As a light-blocking film, it is common to use a chromium film formed by sputtering. FIG. 15 shows the relationship between the thickness of a chromium film and the transmittance thereof. Light-blocking performance usually required is 0.1% or less in terms of transmittance. Thus, it will be understood that a light-blocking film is required to have a thickness of at least 60 nm. In general, a light-blocking film may be required to have an anti-reflective function. In this case, an anti-reflective film is needed in addition to the chromium film. Accordingly, it is common for the light-blocking film to have a thickness of 100 nm or more.

In general, when a phase shift film is formed over a light-blocking film pattern having steps, steps which are equal or close to those of the light-blocking film pattern also occur on the surface of the phase shift film. Further, it is generally observed that, as shown in FIG. 16, the surface of the phase shift film (shifter film) is tapered toward an opening portion of the light-blocking film, depending upon the type of method used for forming the phase shift film. In this case, the amount of phase shift given to exposure light becomes nonuniform at the opening portion, causing the effect of the phase shift mask to be reduced.

Phase shift films are generally formed by using a silicon oxide film. In a case where the silicon oxide film has a thickness variation of 60 nm, which is equal to the above-described chromium step height, in the opening portion, the variation of the phase shift is as large as about 30° in the case of i-line lithography and nearly 45° in the case of KrF excimer laser lithography. When the variation of the film thickness, including the anti-reflective film, is 100 nm, the phase shift variation is about 50° in the i-line lithography and about 70° in the KrF excimer laser lithography. A phase shift mask having such a large phase shift variation cannot be used in practical application.

Conversely, when the phase shift variation allowable range is assumed to be ±10°, the thickness variation allowable for the phase shift film of silicon oxide is only about 20 nm in the case of i-line lithography and about 14 nm in the case of KrF excimer laser lithography. Accordingly, unless a special film forming method is adopted, the allowable step height of the light-blocking film pattern becomes considerably smaller than the above-described step height 60 nm, although it depends on the type of shifter film forming method employed. Thus, the light-blocking performance is undesirably degraded, as will be clear from FIG. 15.

SUMMARY OF THE INVENTION

In view of the above-described problems of the conventional techniques, an object of the present invention is to provide a phase shift mask, e.g. a halftone phase shift mask, which has a light-blocking pattern with a reduced transmittance at a region outside a device pattern area which corresponds to a region subjected to multiple exposure during transfer effected by using the mask.

Another object of the present invention is to provide a halftone phase shift mask which should form an ultra-fine pattern and is capable of suppressing during exposure the occurrence of a sub-peak of light intensity, which has an adverse effect on the image formation, and which has a light-blocking pattern with a reduced transmittance at a region outside a device pattern area which corresponds to a region subjected to multiple exposure during transfer effected by using the mask, and also provide a method of producing the halftone phase shift mask.

Still another object of the present invention is to provide an overlying shifter type phase shift mask having excellent phase shift effect, which is designed so that, in a region where a phase shift effect is required, it is possible to minimize thickness variations of a phase shift film due to steps in a patterned light-blocking film, and in a region where a satisfactorily high opacity is required, the mask exhibits satisfactory light-blocking characteristics.

To attain the above-described objects, the present invention provides a halftone phase shift mask having on a transparent substrate a halftone phase shift film comprising a single layer or a plurality of layers. At least one layer of the halftone phase shift film consists essentially of a compound of at least one metallic element and at least one element selected from the group consisting of oxygen, fluorine, carbon, nitrogen, and chlorine. The halftone phase shift mask is characterized in that the content of the at least one element selected from among oxygen, fluorine, carbon, nitrogen, and chlorine in the compound in a region on the transparent substrate differs from that in another region on the transparent substrate.

In addition, the present invention provides another halftone phase shift mask which has on a transparent substrate a halftone phase shift film comprising a single layer or a plurality of layers. The halftone phase shift mask is characterized in that at least one layer of the halftone phase shift film is a film which consists essentially of a compound of chromium and oxygen in a region on the transparent substrate, and which consists essentially of a compound of chromium and fluorine in another region on the transparent substrate.

In the above-described halftone phase shift masks, assuming that the transmittance for exposure light of the transparent substrate is 100%, the transmittance for the exposure light of the halftone phase shift film is not more than 1% in the first-mentioned region, and it is from 1% to 50% in the second-mentioned region. It is desirable for the transmittance in the second-mentioned region to be from 5% to 30%.

In this case, the first-mentioned region may be either a peripheral portion of the halftone phase shift mask which includes a region corresponding to a region subjected to multiple exposure during transfer effected by using the mask, or a peripheral portion of a pattern which is resolvable without using the halftone phase shift effect.

In addition, the present invention provides a third halftone phase shift mask which has on a transparent substrate a halftone phase shift film comprising a single layer or a plurality of layers. The halftone phase shift mask is characterized in that a region on the transparent substrate is provided with a pattern of an ultra-fine particle film which blocks exposure light.

In this case, the region that is provided with the pattern of an ultra-fine particle film may be a peripheral portion of the halftone phase shift mask which includes a region corresponding to a region subjected to multiple exposure during transfer effected by using the mask, or a peripheral portion of a pattern which is resolvable without using the halftone phase shift effect.

In the third halftone phase shift mask according to the present invention, the ultra-fine particle film can be formed by spraying gaseous ultra-fine particles on the substrate.

In addition, the present invention provides a fourth phase shift mask which has at least a first pattern of a light-blocking film on a transparent substrate, and a second pattern of a phase shift film stacked over the first pattern. The phase shift mask is characterized in that the light-blocking film has a relatively large thickness in a region on the transparent substrate and a relatively small thickness in another region on the transparent substrate.

In this case, it is desirable that the region in which the light-blocking film has a relatively large thickness should include a region corresponding to a region subjected to multiple exposure during transfer effected by using the phase shift mask.

In addition, the present invention provides a fifth phase shift mask which has at least a first pattern of a light-blocking film on a transparent substrate, and a second pattern of a phase shift film stacked over the first pattern. The phase shift mask is characterized in that the light-blocking film is a multi-layer film comprising a plurality of layers, and that the multi-layer film has a relatively large number of layers in a region on the transparent substrate, and it has a single layer or a relatively small number of layers in another region on the transparent substrate.

In this case, it is desirable that the region in which the light-blocking film has a relatively large number of layers should include a region corresponding to a region subjected to multiple exposure during transfer effected by using the phase shift mask.

In addition, the present invention provides a sixth phase shift mask which has at least a first pattern of a light-blocking film on a transparent substrate, and a second pattern of a phase shift film stacked over the first pattern. The phase shift mask is characterized by having a third pattern of light-blocking properties which is formed on the second pattern.

In this case, it is desirable for the third pattern to be formed in a region including a region corresponding to a region subjected to multiple exposure during transfer effected by using the phase shift mask.

Let us give some supplementary explanation of the present invention, together with the operations of the first and second halftone phase shift masks.

The present invention provides a halftone phase shift mask having on a transparent substrate a halftone phase shift film comprising a single layer or a plurality of layers, in which at least one layer of the halftone phase shift film consists essentially of a compound of at least one metallic element and at least one element selected from the group consisting of oxygen, fluorine, carbon, nitrogen, and chlorine. After the halftone phase shift mask has been processed into a predetermined pattern, the content of the at least one element selected from among oxygen, fluorine, carbon, nitrogen, and chlorine in the compound is changed in a region corresponding to a multiple-exposure region which is subjected to repeated exposure for shots which are adjacent to each other during transfer exposure, or in a part or the whole of a pattern which can be satisfactorily transferred without using a halftone phase shift effect, thereby reducing the transmittance for exposure light in that region, and thus enabling the above-described problems to be solved.

More specifically, assuming that the transmittance of the transparent substrate is 100%, the transmittance of the halftone phase shift film, which is from 1% to 50% after patterning processing, is reduced to not more than 1% at the above-described region. By doing so, the above-described problems can be solved.

The change in the composition of a layer constituting the halftone phase shift film may be made by uniformly changing the composition throughout a specific layer in the direction of the thickness thereof, or changing the composition in only a part of the layer. In a case where the halftone phase shift film comprises a multiplicity of layers, the compositions of a plurality of layers may be changed simultaneously.

The method according to the present invention may be used in combination with the conventional solution (A) or (B). The method according to the present invention may be adopted not only for a region of concern as described above but also for a region which needs to reduce the transmittance for other reasons.

Examples of methods usable to change the composition of the above-described compound are a method wherein a specific region is irradiated with an electromagnetic wave, a particle beam, heat rays, etc. in the atmospheric air, a vacuum, or an active atmosphere, and a method wherein, after a region in which the composition is not desired to change has been masked, the whole blank is exposed to an active atmosphere. Thus, the above-described problems can be solved without forming an ultra-fine pattern and by basically a single lithography process.

Further, the above-described problems can be solved by forming a pattern of an ultra-fine particle film in a region of the halftone phase shift mask where light-blocking properties are required. The third halftone phase shift mask according to the present invention has this arrangement.

More specifically, an ultra-fine particle film is formed in a region corresponding to a region outside a device pattern area which corresponds to a region that is subjected to two or more exposure operations in a step-and-repeat exposure process, or in a region within the device pattern area which is resolvable without using a halftone phase shift effect. By doing so, light-blocking properties in these regions can be improved.

It should be noted that the ultra-fine particle film can be formed by spraying ultra-fine particles on a substrate and subjecting it to post-treatment. Therefore, no lithography process is needed to form the ultra-fine particle film.

FIG. 9 shows the arrangement of a commercially available system for forming an ultra-fine particle film. The system comprises an ultra-fine particle generating chamber 701 and a film forming chamber 702. The two chambers are connected through an ultra-fine particle transport pipe 703 and partitioned off from each other by a valve 704. The two chambers can be evacuated by respective vacuum pumps 705 and 706. An inert gas, e.g. argon, can be introduced into the ultra-fine particle generating chamber 701 through a valve 707. A raw material used to generate ultra-fine particles is set in a heating boat 708 provided in the ultra-fine particle generating chamber 701. A substrate on which an ultra-fine particle film is to be formed is set on an X-Y stage 709 provided in the film forming chamber 702.

By using the above-described system, an ultra-fine particle film is formed as follows: With the valves 704 and 707 closed, the ultra-fine particle generating chamber 701 and the film forming chamber 702 are evacuated by the vacuum pumps 705 and 706. Subsequently, the valve 707 is opened to introduce an inert gas into the ultra-fine particle generating chamber 701. Under these conditions, the material in the heating boat 708 is heated, thereby generating ultra-fine particles. The amount and particle diameter of ultra-fine particles generated can be controlled by controlling the feed rate of the inert gas, the pressure in the ultra-fine particle generating chamber 701, the rate of evaporation of the material, etc. The valve 704 is opened when the generation of ultra-fine particles has become stabilized. Consequently, ultra-fine particles are carried to the film forming chamber 702 through the ultra-fine particle transport pipe 703 by a pressure difference between the two chambers and thus sprayed on the substrate set on the X-Y stage 709 through a nozzle 710 at the distal end of the ultra-fine particle transport pipe 703. By moving the X-Y stage 709 under control, a desired pattern of an ultra-fine particle film is formed on the substrate.

As ultra-fine particle materials capable of forming an ultra-fine particle film, metallic materials, e.g. gold, copper, tin, iron, chromium, nickel, etc. are generally used. It is also conceivable to use films of metals other than these metals, alloy films, ceramic films, etc.

An ultra-fine particle film formed by the above-described method enables pattern formation without a lithography process and has satisfactory light-blocking properties. Therefore, when applied to a halftone phase shift mask, the ultra-fine particle film can solve all the above-described problems.

The method according to the present invention may be used in combination with the conventional solution (A) or (B). The method according to the present invention may be adopted not only for a region of concern as described above but also for a region which needs to reduce the transmittance for other reasons.

Further, according to the present invention, a LEVENSON or other similar type of phase shift mask is provided with a region in which the light-blocking film has a relatively large thickness and hence steps are large and the light-blocking performance is high, and a region in which the light-blocking film has a relatively small thickness and hence steps are small and the light-blocking performance is low, thereby solving the above-described problem that a multiple-exposure region is undesirably exposed to exposure light and thus the contrast is unfavorably reduced. The problem can similarly be solved by providing a region in which the number of layers constituting the light-blocking film is relatively large and hence steps are large and the light-blocking performance is high, and a region in which the number of layers constituting the light-blocking film is relatively small and hence steps are small and the light-blocking performance is low.

In general, it is important to a pattern which needs a phase shift effect, e.g. a fine-line pattern in the device pattern area, that a phase difference of a half-wavelength (180°) should be introduced between openings which are adjacent to each other by the phase shift layer, and even if the light-blocking layer lying between the openings does not have a high light-blocking performance, a satisfactory phase shift effect can be expected. On the other hand, a fine-line pattern which needs a phase shift effect is not present in a region where the light-blocking layer is required to exhibit a high light-blocking performance, e.g. a peripheral region of the device pattern area which corresponds to a region subjected to multiple exposure during step-and-repeat exposure. Accordingly, it is possible to previously divide the light-blocking layer into a region where priority is given to the light-blocking performance, and a region where priority is given to the phase shift effect.

More specifically, after an ordinary light-blocking film pattern has been formed on a transparent substrate, a resist mask whereby the light-blocking film pattern is exposed at a region where the light-blocking performance may be sacrificed is formed by the second lithography process. The exposed portion of the light-blocking film is etched by a predetermined amount so as to reduce in thickness, and then the remaining resist is removed, thereby obtaining two regions which are different in film thickness and hence different in light-blocking capability from each other. In a case where it is difficult to control the etch depth, the light-blocking film may be formed as a multi-layer film formed from different materials in advance so that, during the above-described etching process, only a layer of a specific material is etched. By this method, the film thicknesses and light-blocking performances in the two regions can be controlled even more strictly.

The above-described object can also be attained by a method wherein a light-blocking film pattern is formed thin in all regions on the transparent substrate, and after a phase shift film pattern has been formed, a third layer having satisfactory light-blocking properties is formed over the patterns and then subjected to photoengraving.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 10(a) to 10(e) are sectional views showing the sequence of steps for producing a halftone phase shift mask in Example 4 according to the present invention.

FIGS. 13(a) to 13(h) are sectional views showing the sequence of steps for producing a phase shift mask in Example 6 according to the present invention.

FIG. 16 is a view for explanation of a defect due to a step in a light-blocking film of an overlying shifter type phase shift mask.

DESCRIPTION OF THE PREFERRED EMBODIMENTS

The first and second halftone phase shift masks according to the present invention are each a halftone phase shift mask having on a transparent substrate, a halftone phase shift film comprising a single layer or a plurality of layers, in which the composition of the halftone phase shift film is changed in a region on the transparent substrate, thereby changing the transmittance for exposure light in that region. The first and second halftone phase shift masks according to the present invention will be explained below by way of examples of production methods.

EXAMPLE 1

Figure 1A:
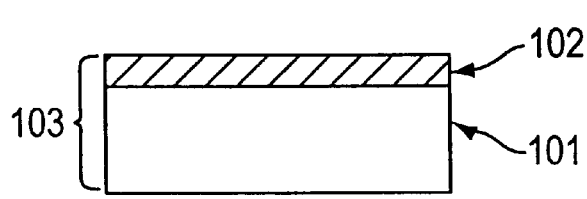
FIGS. 1(a) to 1(e) are sectional views showing the sequence of steps for forming a halftone phase shift mask in Example 1 according to the present invention.

An example of forming a light-blocking frame for preventing a multiple-exposure region from being undesirably exposed to exposure light during pattern transfer according to the present invention will be explained below with reference to FIGS. 1(a) to 1(e), which show the sequence of steps for forming a light-blocking frame. P As shown in FIG. 1(a), on a synthetic quartz substrate 101 for a photomask, which was 6 by 6 inches square and 0.25 inch in thickness, a halftone phase shift film 102 for far ultraviolet (DUV) exposure was formed under the following conditions, thereby obtaining a halftone phase shift mask blank 103 for DUV exposure.

Film forming method: DC magnetron sputtering

Target : metal chromium

Gas and flow rate : argon 75 sccm+carbon tetrafluoride 25 sccm

Sputter pressure : about 4 mTorr

Sputter current : 5 A

It should be noted that the refractive index and extinction coefficient of the film 102 for the wavelength 250 nm are 1.7 and 0.27, respectively. Accordingly, a thickness required for the film 102 to have as a phase shift film for DUV exposure (i.e. a thickness required to retard the phase by 180° with respect to air) is about 185 nm. When the film 102 was formed on the quartz substrate 101 to a thickness of about 185 nm, the transmittance of the film 102 was about 10% on the assumption that the transmittance of the transparent substrate was 100%.

Figure 1B:
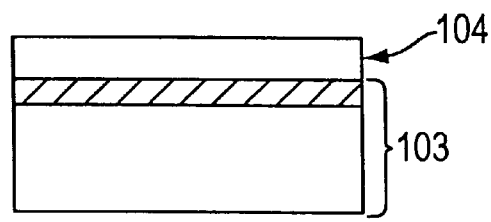
Figure 1C:
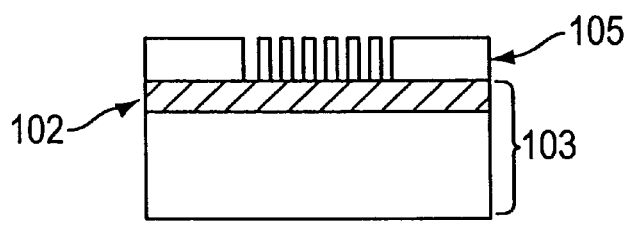

Next, as shown in FIG. 1(b), an electron beam resist 104 was coated on the blank 103 and then patterned by a conventional electron beam lithography method, thereby obtaining a resist pattern 105 as shown in FIG. 1(c). With the resist pattern 105 used as a mask, portions of the halftone phase shift film 102 which were exposed through the resist pattern 105 were dry-etched under the following conditions:

Etching method : RF reactive ion etching

Gas and flow rate: dichloromethane 20 sccm+oxygen 50 sccm

Pressure : about 300 mTorr

Electric power : 250 W

Figure 1D:

Upon completion of the etching process, the resist pattern 105 was removed, thereby obtaining a halftone phase shift mask 106 for DUV exposure as shown in FIG. 1(d).

Figure 1E:
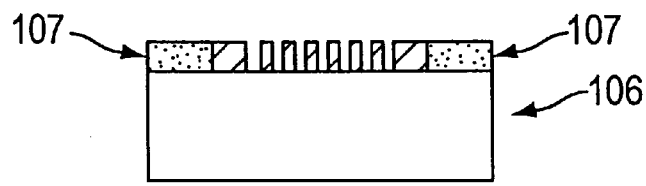

Next, in order to produce a light-blocking frame, as shown in FIG. 1(e), a region 107 at the outer periphery of the patterned halftone phase shift film was irradiated by using a laser irradiator, thereby reducing the transmittance of the region 107 for the wavelength 250 nm. It should be noted that, as the laser irradiator, an apparatus usually used to correct black defects (undesired remainders of chromium) of a chromium mask was used with improvement made thereto.

As a laser, a Q-switched Nb:YAG laser (wavelength: 1.06 μm) was used. An attenuator was installed in front of a focusing optical system in the path from the YAG rod, and a dose was set such that about 1/10 of the exposure light intensity used to correct chromium defects would be applied to a predetermined region. We examined the relationship between damage to a chromium compound halftone phase shift film and harmonics (the second harmonic: wavelength 0.53 μm; and the fourth harmonic: wavelength 0.27 μm). The examination revealed that the transmittance of the phase shift film increased as the wavelength became longer; therefore, it was preferable not to use harmonics with a view to enabling allowances to be made for setting of conditions for preventing damage to the halftone phase shift film. A comparison between a pulsed wave and a continuous wave revealed that the pulsed wave was superior because it enabled the transmittance to be reduced without causing damage to the phase shift film.

Figure 4:
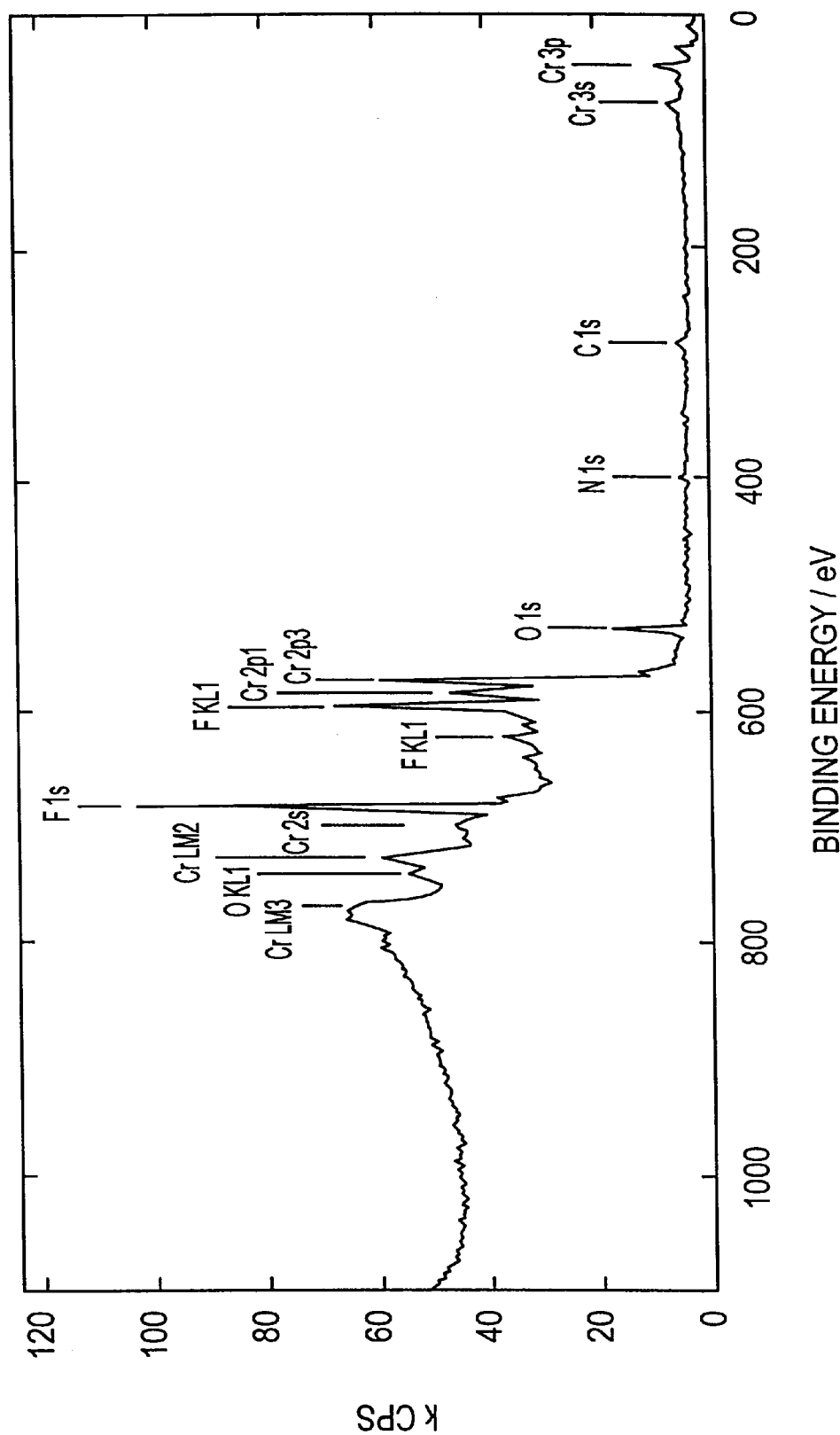
FIG. 4 is a graph showing the results of analysis of a halftone phase shift film before laser irradiation in Example 1 by X-ray photoelectron spectroscopy.
Figure 5:
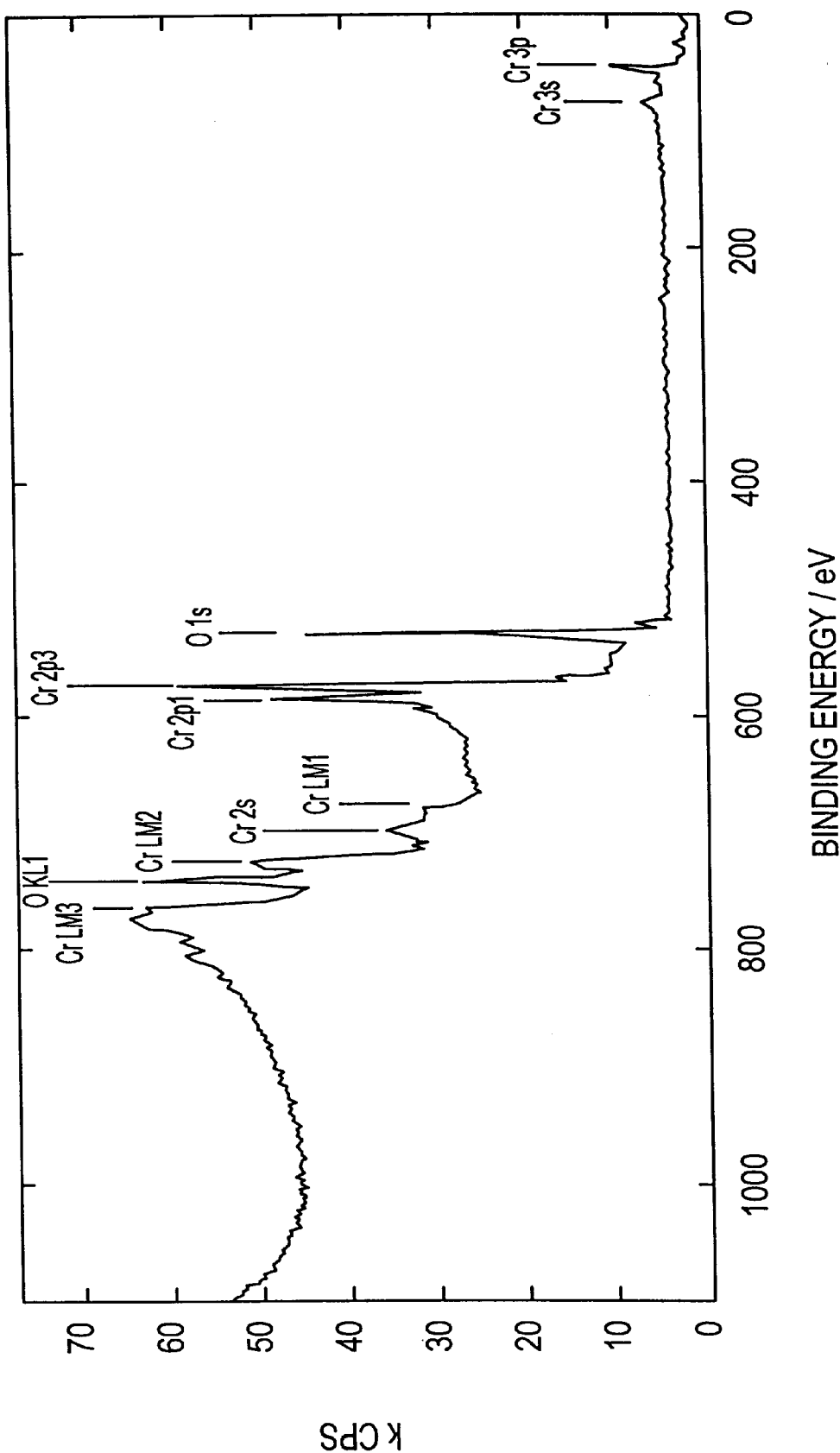
FIG. 5 is a graph showing the results of analysis of the halftone phase shift film after the laser irradiation in Example 1 by X-ray photoelectron spectroscopy.
Figure 6:
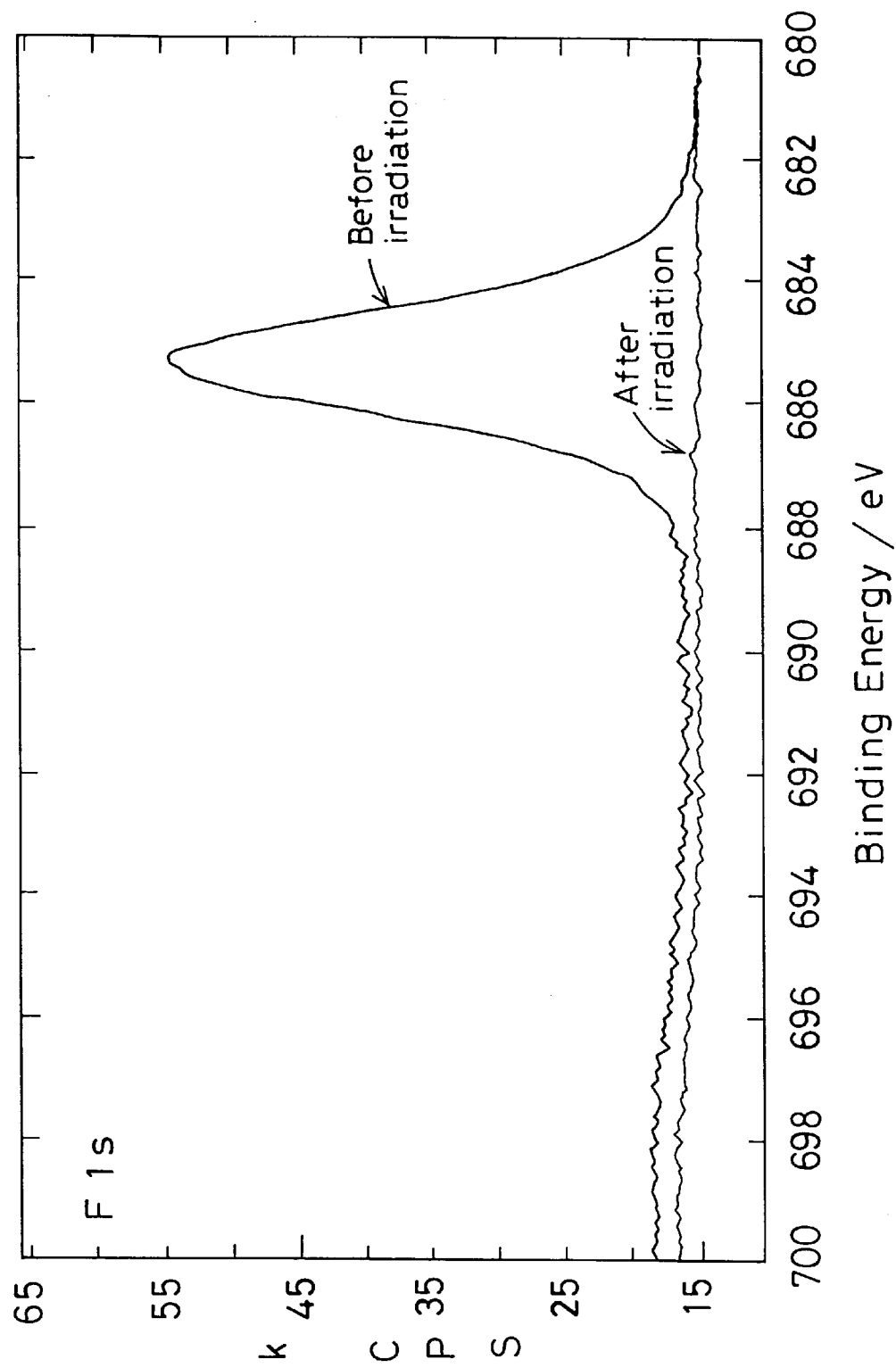
FIG. 6 is a graph comparatively showing the results of analysis of the halftone phase shift film with regard to fluorine before and after the laser irradiation in Example 1.

FIGS. 4 and 5 are graphs respectively showing the results of analysis of the halftone phase shift film before and after the irradiation with pulse laser of 1.06 μm by X-ray photoelectron spectroscopy. FIG. 6 is a graph comparatively showing the results of analysis of the halftone phase shift film with regard to fluorine before and after the laser irradiation. The table below shows results of detection concerning the composition of the halftone phase shift film before and after the laser irradiation on the basis of X-ray photoelectron spectroscopy.

TABLE

| | (units: atomic %) | | | | |
|---|---|---|---|---|---|
| | Cr | F | O | C | N |
| Before irradiation | 25 | 46 | 15 | 11 | 3 |
| After irradiation | 36 | — | 64 | — | — |

It will be understood from FIGS. 4 to 6 and the table above that the laser irradiation causes the fluorine content to reduce and the oxygen content to increase.

Figure 7:
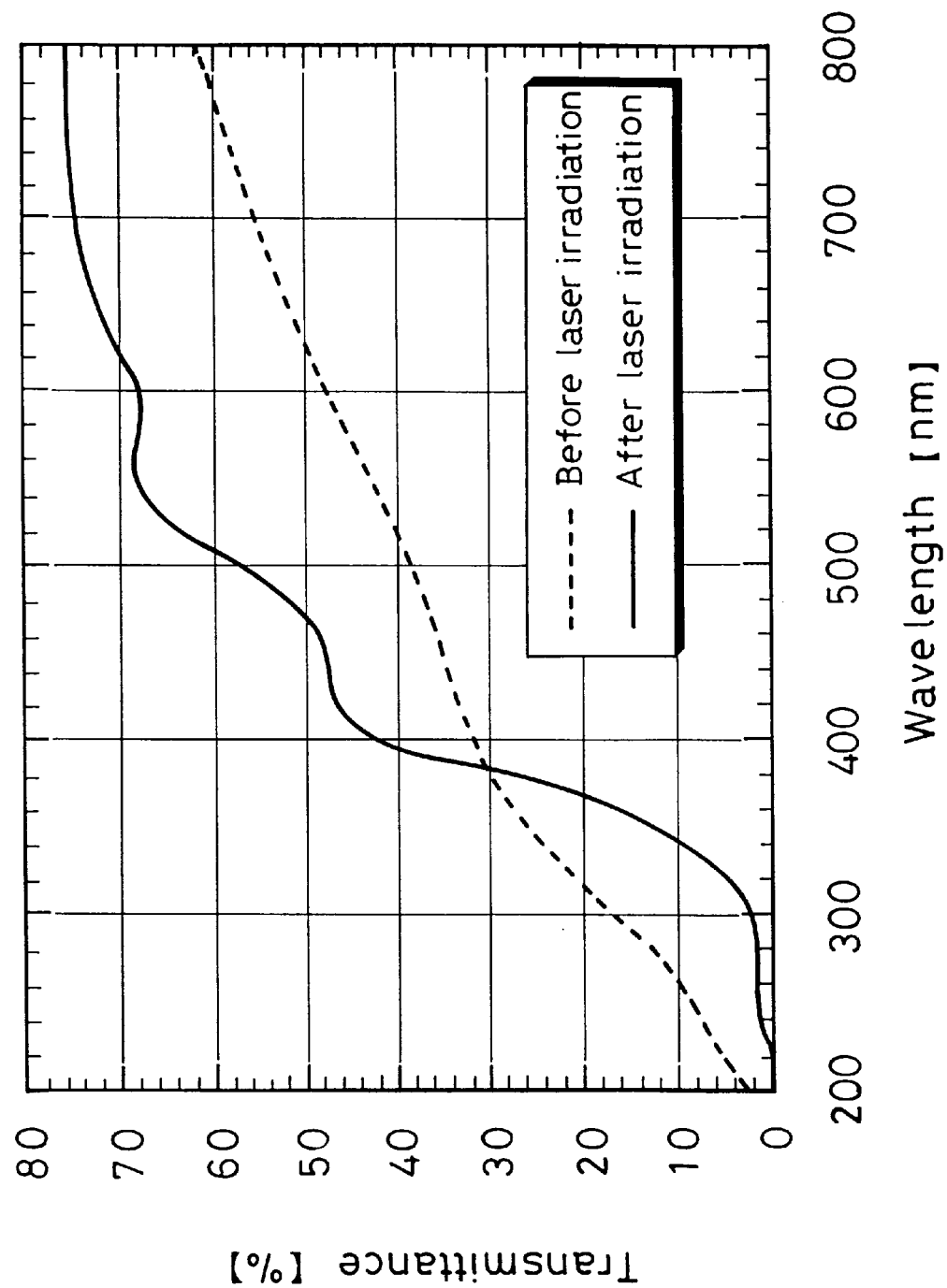
FIG. 7 is a graph showing spectral transmittance curves of the halftone phase shift film before and after the laser irradiation in Example 1.

FIG. 7 is a graph showing spectral transmittance curves of the halftone phase shift film before and after the laser irradiation. It will be understood from the figure that the transmittance for wavelengths in the vicinity of exposure light (250 nm) is made approximately 0% by the laser irradiation, and thus the halftone phase shift film is a favorable light-blocking film.

EXAMPLE 2

An example of a halftone phase shift mask designed according to the present invention so that the effect of a sub-peak is minimized will be explained below with reference to FIGS. 2(a) and 2(b).

Figure 2A:
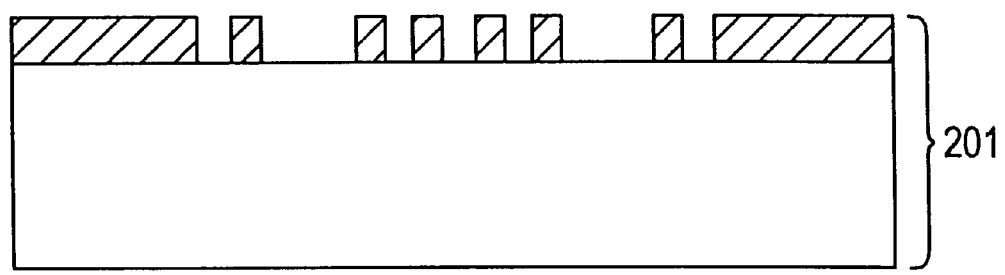
FIGS. 2(a) and 2(b) are sectional views showing the sequence of steps for forming a halftone phase shift mask in Example 2 according to the present invention.

As shown in the sectional view of FIG. 2(a), a halftone phase shift mask 201 was prepared by a method similar to that in Example 1. As shown in FIG. 2(b), a peripheral portion 202 of each large halftone phase shift film pattern which was satisfactorily resolvable without using a halftone phase shift effect was irradiated by using the same laser irradiator as that used in Example 1, thereby reducing the transmittance of the peripheral portions 202. It should be noted that the laser irradiator is one that is usually used for photomask defect correction; therefore, the irradiation position accuracy, irradiation area controllability, etc. of the laser irradiator are adequate to reduce the transmittance by irradiating a peripheral portion of a desired pattern on a photomask. In this example, a peripheral portion irradiated to reduce the transmittance was a region extending through a distance of about 1 μm from the pattern edge.

Figure 2B:
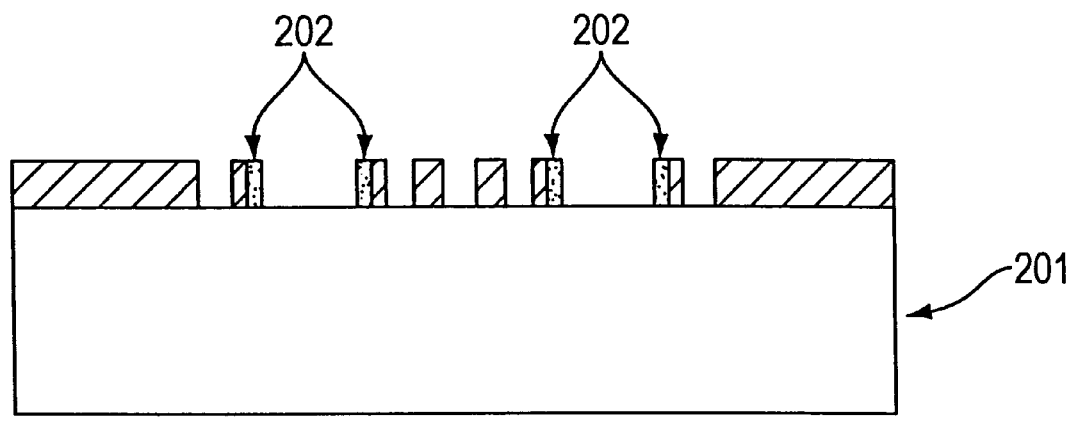

Thus, as shown in the sectional view of FIG. 2(b), it was possible to obtain a halftone phase shift mask in which the halftone phase shift effect was utilized for a fine-line pattern usually difficult to resolve by a photomask, and the sub-peak, i.e. a drawback associated with halftone phase shift masks, was reduced for a large pattern resolvable without using the halftone phase shift effect.

EXAMPLE 3

Another example of forming a light-blocking frame according to the present invention will be explained below.

Figure 8:
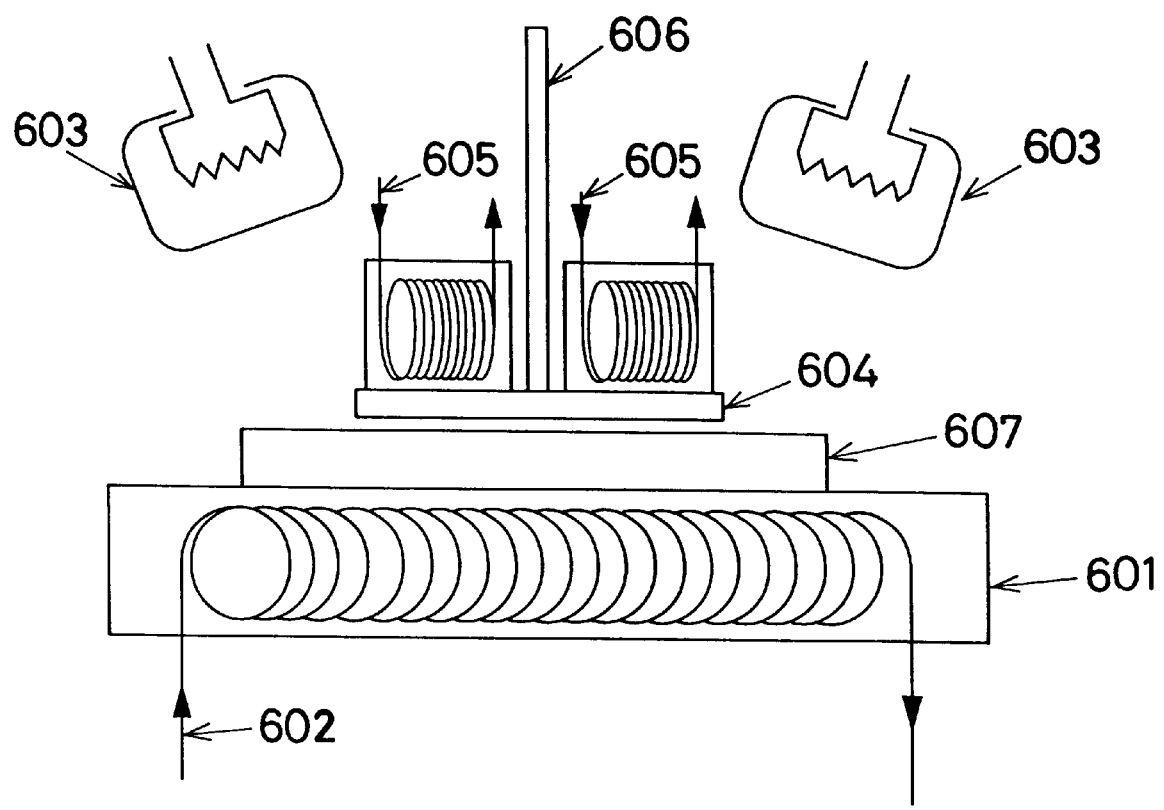
FIG. 8 illustrates the arrangement of a light-blocking frame forming system used in Example 3.

FIG. 8 shows the arrangement of a light-blocking frame forming system used in this example. Referring to the figure, the system has a mask holder 601. A halftone phase shift mask 607 is set on the mask holder 601. It should be noted that the mask holder 601 is arranged such that it can be cooled by a circulating refrigerant 602. Infrared heaters 603 are used to heat a halftone phase shift film of the halftone phase shift mask 607. During the heating process, an area on the halftone phase shift film which will not be formed into a light-blocking frame is shielded from infrared rays by an infrared shielding mask 604. The infrared shielding mask 604 can also be cooled by a circulating refrigerant 605 according to need. The infrared shielding mask 604 is detachable from a support 606. Thus, the light-blocking frame pattern can be changed as desired by changing the shielding mask configuration through replacement of the infrared shielding mask 604.

Figure 3A:
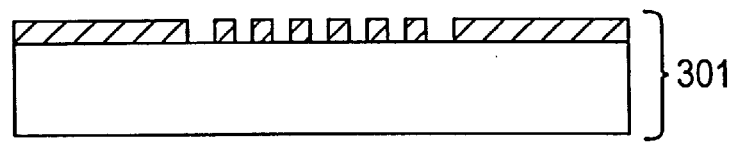
FIGS. 3(a) to 3(c) are sectional views showing the sequence of steps for forming a halftone phase shift mask in Example 3 according to the present invention.
Figure 3B:
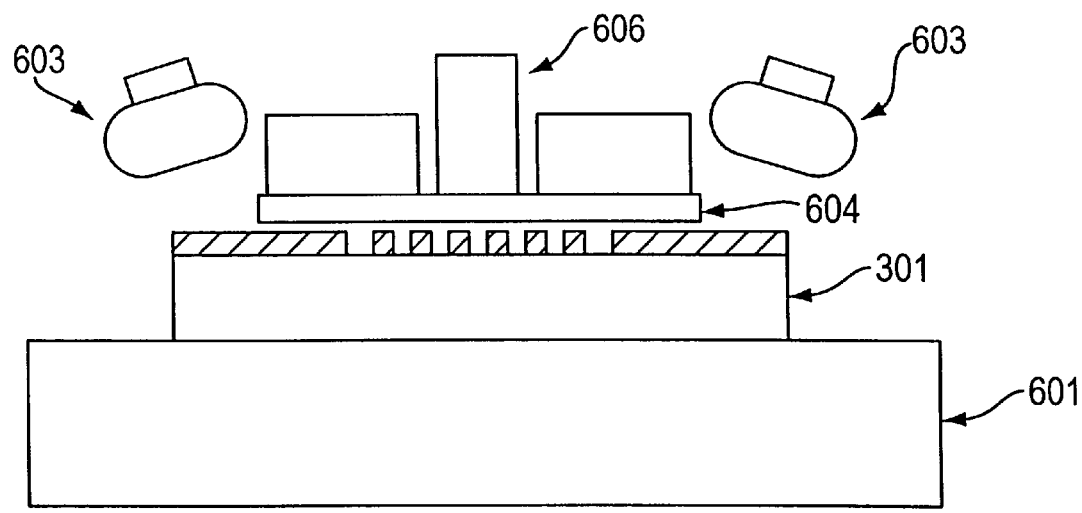
Figure 3C:
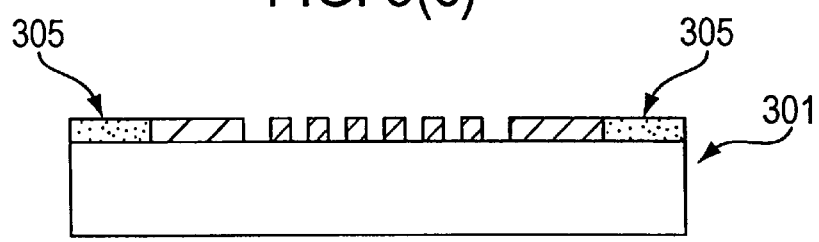

A method of forming a light-blocking frame by using the light-blocking frame forming system shown in FIG. 8 will be explained below with reference to FIGS. 3(a) to 3(c). As shown in the sectional view of FIG. 3(a), a halftone phase shift mask 301 is prepared by a method similar to that in Example 1. As shown in FIG. 3(b), the halftone phase shift mask 301 is set on the mask holder 601 of the light-blocking frame forming system. At this time, the atmosphere remains in the atmospheric air. Next, an infrared shielding mask 604 of the desired configuration is attached to the support 606, and brought close to the surface of the halftone phase shift mask 301 to such an extent that the infrared shielding mask 604 almost contacts the surface of the halftone phase shift film of the halftone phase shift mask 301. Subsequently, the infrared heaters 603 are turned on, and the mask holder 601 and the infrared shielding mask 604 are each supplied with cooling water at an appropriate flow rate, thereby keeping the surface temperature at the region not shielded by the infrared shielding mask 604 at about 450° C. and the surface temperature at the region shielded by the infrared shielding mask 604 at about 250° C. This state is maintained for 60 minutes, thereby obtaining a desired light-blocking frame 305 as shown in FIG. 3(c).

The light-blocking frame obtained by the above-described method was approximately similar to that shown in Example 1.

Next, an example of the third halftone phase shift mask according to the present invention will be explained. The third halftone phase shift mask is a halftone phase shift mask having at least a halftone phase shift film on a transparent substrate. The halftone phase shift mask has a pattern of an ultra-fine particle film which is formed in a region thereof. An example of forming a light-blocking frame for preventing a multiple-exposure region from being undesirably exposed to exposure light during transfer effected by using the halftone phase shift mask will be explained below with reference to FIGS. 10(a) to 1(e), which show the sequence of steps for producing a halftone phase shift mask according to the present invention.

EXAMPLE 4

As shown in FIG. 10(a), on a synthetic quartz substrate 801 for a photomask, which was 6 by 6 inches square and 0.25 inch in thickness, a halftone phase shift film 802 for far ultraviolet (DUV) exposure was formed under the following conditions, thereby obtaining a halftone phase shift mask blank 803 for DUV exposure.

Film forming method: DC magnetron sputtering

Target : metal chromium

Gas and flow rate : argon 75 sccm+carbon tetrafluoride 25 sccm

Sputter pressure : about 4 mTorr

Sputter current : 5 A

It should be noted that the refractive index and extinction coefficient of the film 802 for the wavelength 250 nm are 1.7 and 0.27, respectively. Accordingly, a thickness required for the film 802 to have as a phase shift film for DUV exposure is about 185 nm. When the film 802 was formed on the quartz substrate 801 to a thickness of about 185 nm, the transmittance of the film 802 was about 10% on the assumption that the transmittance of the transparent substrate was 100%.

Next, as shown in FIG. 10(b), an electron beam resist 804 was coated on the blank 803 and then patterned by a conventional electron beam lithography method, thereby obtaining a resist pattern 805 as shown in FIG. 10(c). With the resist pattern 805 used as a mask, portions of the halftone phase shift film 802 which were exposed through the resist pattern 805 were dry-etched under the following conditions:

Etching method : RF reactive ion etching

Gas and flow rate: dichloromethane 20 sccm+oxygen 50 sccm

Pressure : about 300 mTorr

Electric power : 250 W

Upon completion of the etching process, the resist pattern 805 was removed, thereby obtaining a halftone phase shift mask 806 for DUV exposure as shown in FIG. 10(d).

Figure 9:
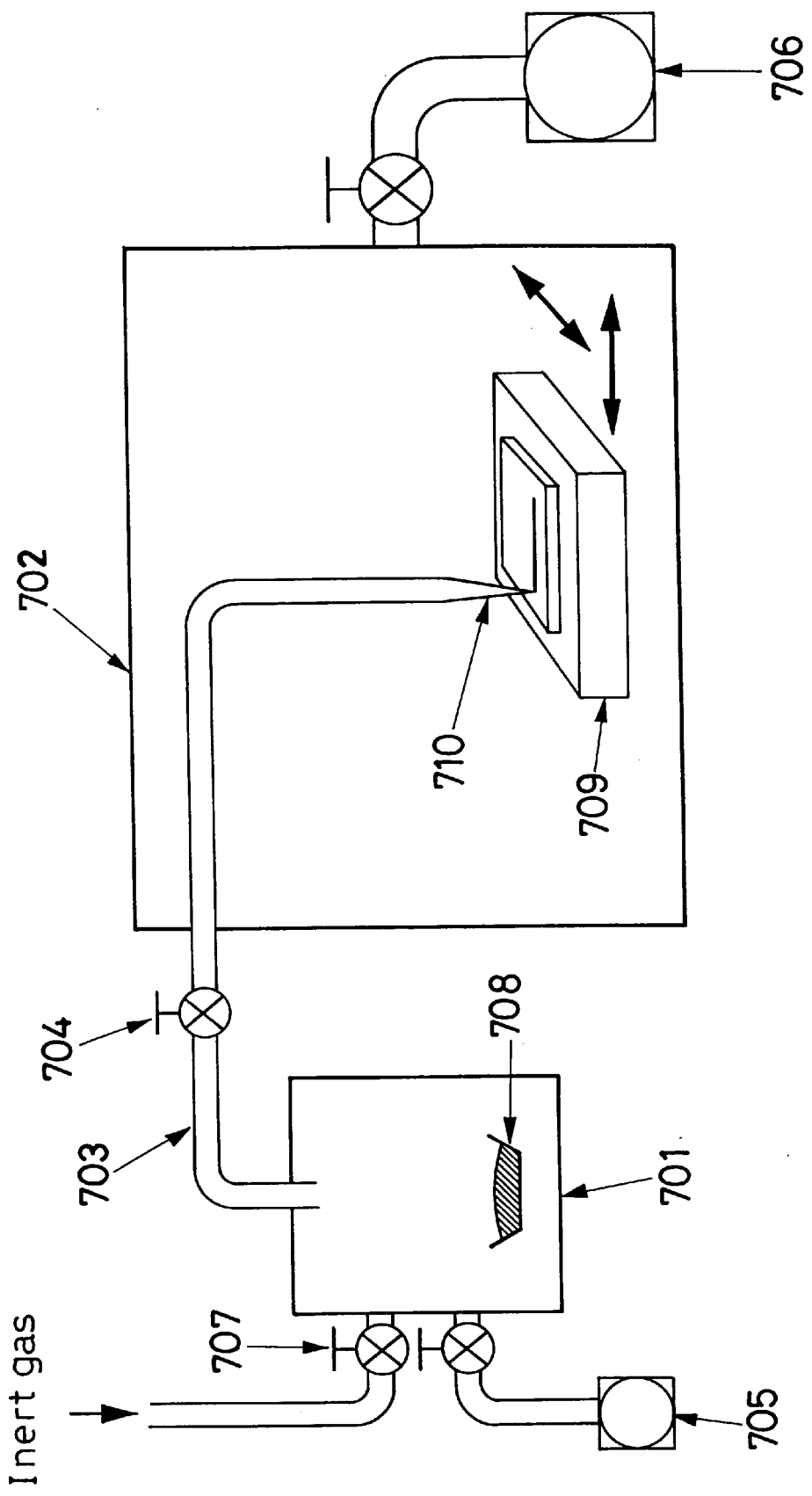
FIG. 9 shows the arrangement of a system for forming an ultra-fine particle film in the present invention.
Figure 11A:
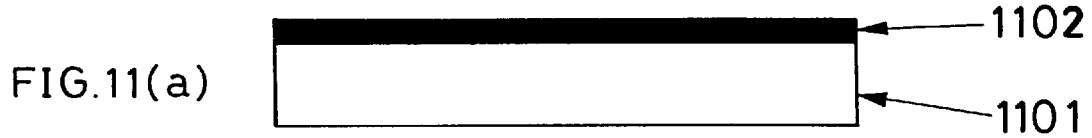
FIGS. 11(a) to 11(f) are sectional views showing a part of the sequence of steps for producing a phase shift mask in Example 5 according to the present invention.
Figure 11B:
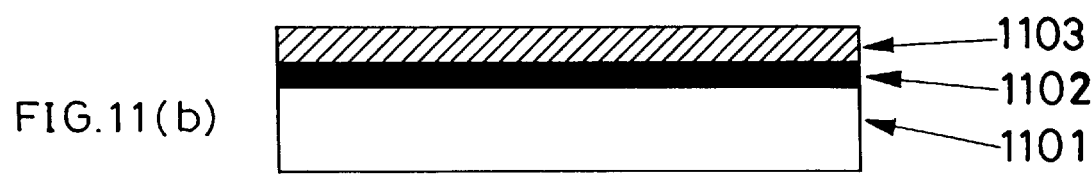
Figure 11C:
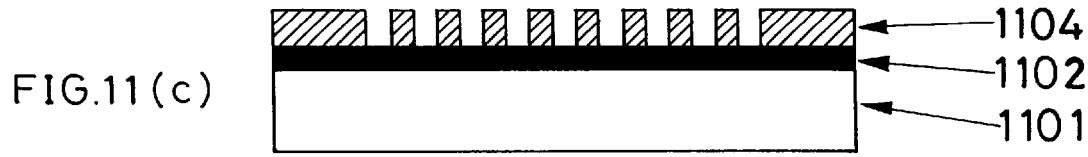
Figure 11D:
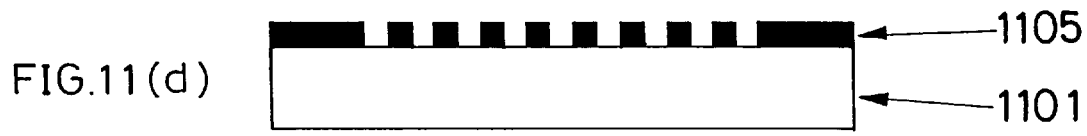
Figure 11E:
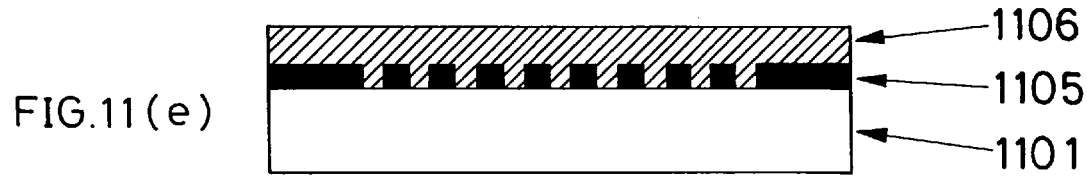
Figure 11F:
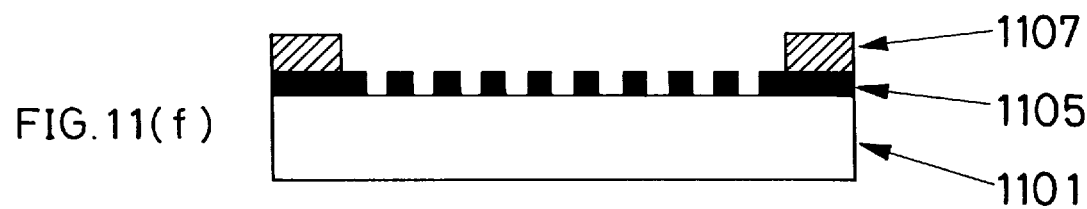
Figure 12G:
FIGS. 12(g) to 12(k) are sectional views showing the other part of the sequence of steps for producing the phase shift mask in Example 5.
Figure 12H:
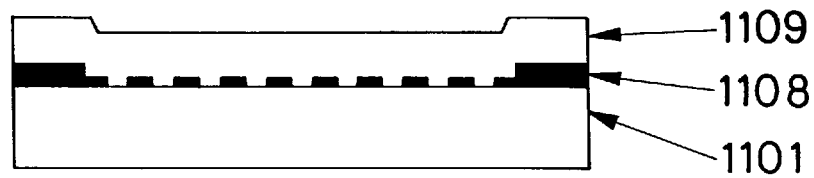
Figure 12I:
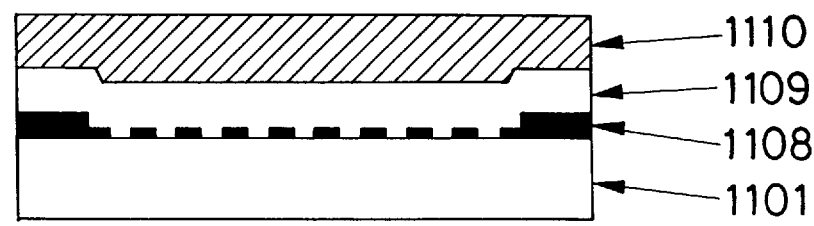
Figure 12J:
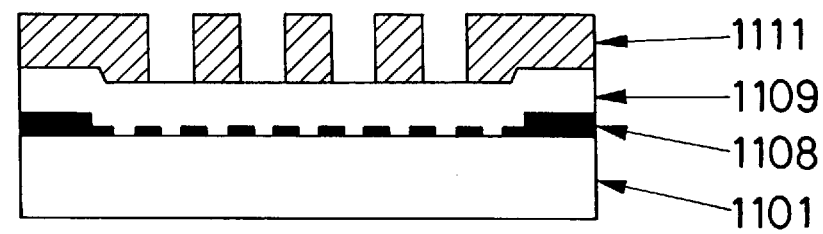
Figure 12K:
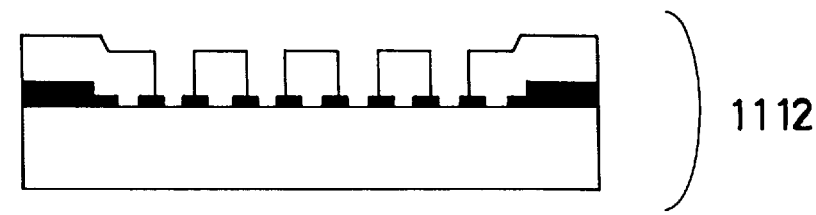

Next, in order to produce a light-blocking frame on a peripheral portion of the halftone phase shift mask 806, as shown in FIG. 10(e), an ultra-fine particle film 807 was formed in a region outside the device pattern area which had practically no need of a halftone phase shift effect and which corresponded to a region subjected to double or multiple exposure during step-and-repeat exposure, by using the ultra-fine particle film forming system shown in FIG. 9 as described below.

In the ultra-fine particle film forming system, an ultra-fine particle Fe film 807 is formed under the following conditions: An Fe chunk as a raw material is placed on the heating boat 708, and the ultra-fine particle generating chamber 701 is evacuated by the vacuum pump 705. Subsequently, the valve 707 is opened to introduce helium gas such that the pressure in the ultra-fine particle generating chamber 701 becomes about 300 Torr. At the same time, the film forming chamber 702 is evacuated by the vacuum pump 706 such that the pressure in the film forming chamber 702 reaches 10 mTorr or below. Next, the valve 704 is opened to produce a flow of gas from the ultra-fine particle generating chamber 701 toward the film forming chamber 702. At this time, the heating boat 708 is supplied with an electric current to effect heating such that the temperature of the Fe chunk is just above the evaporation temperature of Fe (i.e. about 1,550° C.). As a result, the raw material becomes ultra-fine particles by so-called in-gas evaporation, and the ultra-fine particles are carried to the film forming chamber 702 by the flow of gas.

In this example, the tip diameter of the nozzle 710 at the distal end of the ultra-fine particle transport pipe 703 is 300 μm. In this case, an ultra-fine particle film with a width of about 200 μm is formed on the substrate. Under these conditions, the deposition rate is about 20 μm/sec., which is considerably high. Accordingly, it was possible to form an ultra-fine particle film 807 of satisfactorily high light-blocking properties even when the substrate was scanned at high speed by the X-Y stage 709.

The ultra-fine particle film formed by the above-described method has excellent adhesion to the substrate; therefore, it is not separated from the substrate by a scrubbing process during cleaning of the photomask. Although an Fe film is formed in this example, it should be noted that the Fe film is merely an example, and that it is possible to form a film of any of various metals, e.g. chromium, gold, copper, tin, nickel, etc. and alloys of these metals.

Next, examples of the fourth to sixth phase shift masks according to the present invention will be explained specifically on the basis of production methods thereof.

EXAMPLE 5

An example of a phase shift mask for i-line exposure according to the present invention will be explained below with reference to FIGS. 11(*a*) to 12(*k*), which show the sequence of steps for producing the phase shift mask.

First, as shown in FIG. 11(*a*), on a synthetic quartz substrate 1101 for a photomask, which was 6 by 6 inches square and 0.25 inch in thickness, a chromium light-blocking film 1102 was formed to a thickness of 100 nm under the following conditions:

Film forming method: DC magnetron sputtering

Target : metal chromium

Gas and flow rate : argon 80 sccm+nitrogen 20 sccm

Sputter pressure : about 5 mTorr

Sputter current : 6 A

It should be noted that the transmittance for the wavelength 365 nm of the light-blocking film 1102 formed as described above was approximately 0% on the assumption that the transmittance of the transparent substrate 1101 was 100%.

Next, as shown in FIG. 11(*b*), an electron beam resist 1103 was coated on the blank and then patterned by a conventional electron beam lithography method, thereby obtaining a resist pattern 1104 as shown in FIG. 11(*c*). with the resist pattern 1104 used as a mask, portions of the chromium light-blocking film 1102 which were exposed through the resist pattern 1104 were selectively etched by a cerium nitrate wet etchant. It should be noted that the etching time was 40 seconds. Upon completion of the etching process, the remaining resist pattern 1104 was removed, thereby obtaining a light-blocking film pattern 1105 as shown in FIG. 11(*d*).

After the substrate had been thoroughly cleaned, as shown in FIG. 11(*e*), an electron beam resist 1106 was coated again and patterned by a conventional electron beam lithography, thereby obtaining a resist pattern 1107, as shown in FIG. 11(*f*), whereby a portion of the chromium light-blocking film 1105 inside the device pattern area was exposed.

Subsequently, the exposed chromium light-blocking film 1105 was etched for a time equal to 75% of the above-described etching time, i.e. for 30 seconds, by using the above-described wet etchant, thereby providing a region of a relatively small thickness. The thickness of the chromium light-blocking film 1105 in the small-thickness region was about 25 nm. Thereafter, the remaining resist was removed, thereby obtaining a light-blocking film 1108 having two regions of different thicknesses according to the present invention, as shown in FIG. 12(*g*).

Next, as shown in FIG. 12(*h*), a commercially available spin-on-glass (e.g. OCD, manufactured by Tokyo Applied Chemistry Co., Ltd.) was spin-coated over the light-blocking film 1108 to a thickness of 385 nm. After drying, firing was carried out in the air at 250° C., thereby obtaining a phase shift film 1109 having a phase shift quantity of approximately 180°. Subsequently, as shown in FIG. 12(*i*), an ordinary photoresist 1110 was coated on the phase shift film 1109 and then patterned by a lithography method using a laser beam pattern lithography system, thereby forming a resist pattern 1111 as shown in FIG. 12(*j*). Next, with the resist pattern 1111 used as a mask, the exposed phase shift film 1109 was selectively etched by a conventional dry etching method. Thereafter, the remaining resist pattern 1111 was removed, thereby obtaining a phase shift mask 1112 according to the present invention, as shown in FIG. 12(*k*).

EXAMPLE 6

Next, an example of another phase shift mask for i-line exposure according to the present invention will be explained with reference to FIG. 13(*a*) to 13(*h*), which show the sequence of steps for producing the phase shift mask.

As shown in FIG. 13(*a*), a light-blocking film comprising two layers 1202 and 1203 was formed on a transparent substrate 1201. The layers 1202 and 1203 were successively formed according to the following conditions (1) and (2). It should be noted that the two layers 1202 and 1203 were formed in a stroke without taking out the blank from the vacuum equipment.

Conditions (1)

Film forming method: DC magnetron sputtering

Target : metal chromium

Gas and flow rate : argon 95 sccm+carbon tetrafluoride 5 sccm

Sputter pressure : about 5 mTorr

Sputter current : 6 A

Conditions (2)

Film forming method: DC magnetron sputtering

Target : metal chromium

Gas and flow rate : argon 80 sccm+nitrogen 20 sccm

Sputter pressure : about 5 mTorr

Sputter current : 6 A

The first layer 1202 had a thickness of about 20 nm, and the second layer 1203 had a thickness of about 100 nm. Next, as shown in FIG. 13(*b*), an ordinary electron beam resist 1204 was coated on the light-blocking film and then patterned by a conventional electron beam lithography method, thereby obtaining a resist pattern 1205 as shown in FIG. 13(*c*). Subsequently, portions of the light-blocking film exposed through the resist pattern 1205 were dry-etched under the following conditions:

Etching method : RF reactive ion etching

Gas and flow rate: dichloromethane 50 sccm+oxygen 20 sccm

Pressure : about 300 mTorr

Electric power : 250 W

It should be noted that the above-described dry etching can remove both the layers 1202 and 1203 constituting the light-blocking film. After the etching process, the remaining resist was removed, thereby obtaining a light-blocking film pattern 1206 as shown in FIG. 13(d).

Next, after the substrate had been thoroughly cleaned, as shown in FIG. 13(e), an electron beam resist 1207 was coated again, and patterned such that the light-blocking film was exposed only at a device pattern area 1208, as shown in FIG. 13(f). Subsequently, the second layer 1203 of the light-blocking film was selectively etched by using a cerium nitrate wet etchant (e.g. MR-ES, manufactured by Inktec). Then, the remaining resist was removed, thereby obtaining a light-blocking film pattern 1209 according to the present invention, as shown in FIG. 13(g). It should be noted that the first layer 1202 formed under the above-described conditions (1) dissolves in the above-described wet etchant at an extremely low rate and it is not practically etched; therefore, only the film 1203 is removed, and the film 1202 remains.

Thereafter, a phase shift film was formed from spin-on-glass and patterned in the same way as in Example 5, thereby obtaining a phase shift mask 1210 according to the present invention, as shown in FIG. 13(h).

EXAMPLE 7

Finally, an example of still another phase shift mask for i-line exposure according to the present invention will be explained with reference to FIG. 14(a) to 14(g), which show the sequence of steps for producing the phase shift mask.

Figure 14A:
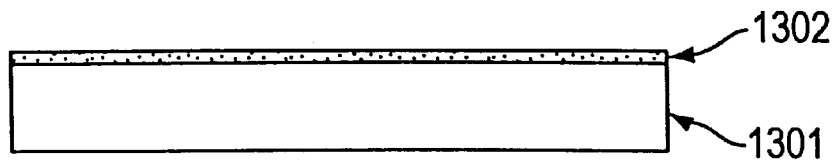
FIGS. 14(a) to 14(g) are sectional views showing the sequence of steps for producing a phase shift mask in Example 7 according to the present invention.

As shown in FIG. 14(a), on a synthetic quartz substrate 1301 for a photomask, which was 6 by 6 inches square and 0.25 inch in thickness, a chromium light-blocking film 1302 with a thickness of 30 nm was formed under the following conditions:

Film forming method: DC magnetron sputtering

Target : metal chromium

Gas and flow rate : argon 80 sccm+nitrogen 20 sccm

Sputter pressure : about 5 mTorr

Sputter current : 6 A

It should be noted that the transmittance for the wavelength 365 nm of the light-blocking film 1302 formed as described above was about 7% on the assumption that the transmittance of the transparent substrate 1301 was 100%.

Figure 14B:
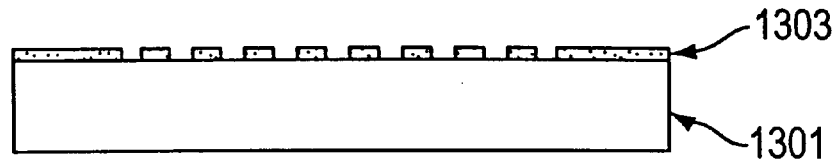

Next, the light-blocking film 1302 was patterned in the same way as in Example 5, thereby obtaining a light-blocking film pattern 1303 as shown in FIG. 14(b).

Figure 14C:
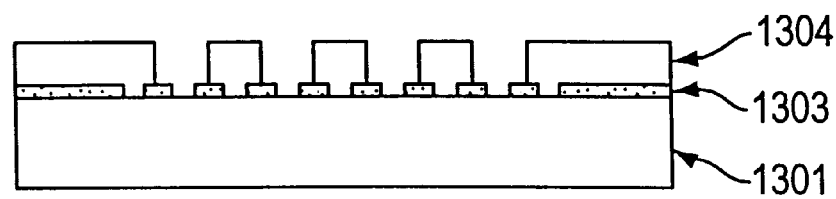

Subsequently, a shifter film of spin-on-glass was formed over the light-blocking film pattern 1303 and patterned in the same way as in Example 5, thereby obtaining a shifter pattern 1304 as shown in FIG. 14(c).

Figure 14D:
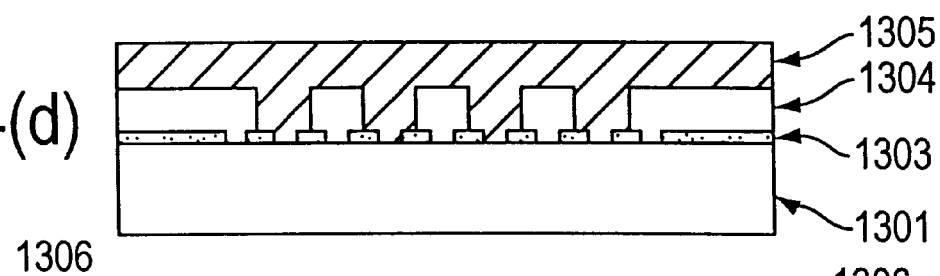
Figure 14E:
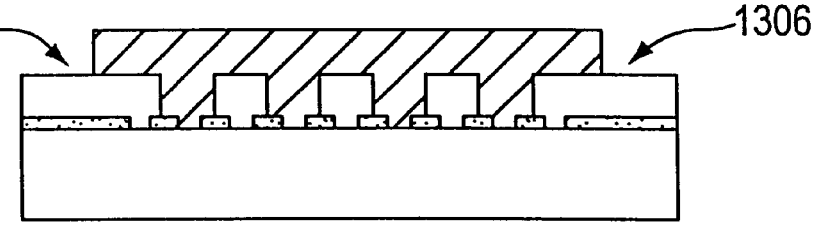
Figure 14F:
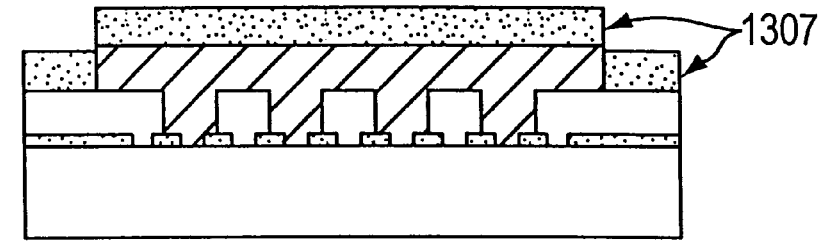

As shown in FIG. 14(d), an ordinary electron beam resist 1305 was coated all over the shifter pattern 1304 and then patterned by a conventional method such that the shift film 1304 was exposed only at a region 1306 outside the device pattern area, as shown in FIG. 14(e). Further, a second light-blocking film 1307 was formed over the electron beam resist 1305 and the exposed region 1306 of they shift film 1304, as shown in FIG. 14(f), under the same conditions as those for forming the above-described light-blocking film 1302. It should be noted that the second light-blocking film 1307 had a thickness of about 100 nm.

Figure 14G:
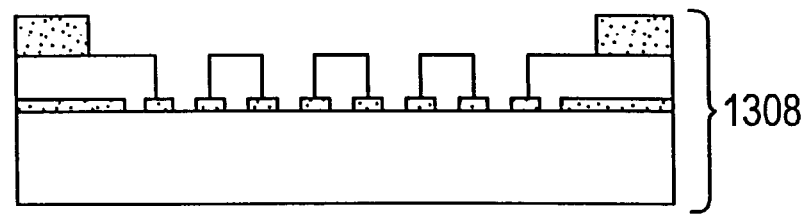
Figure 15:
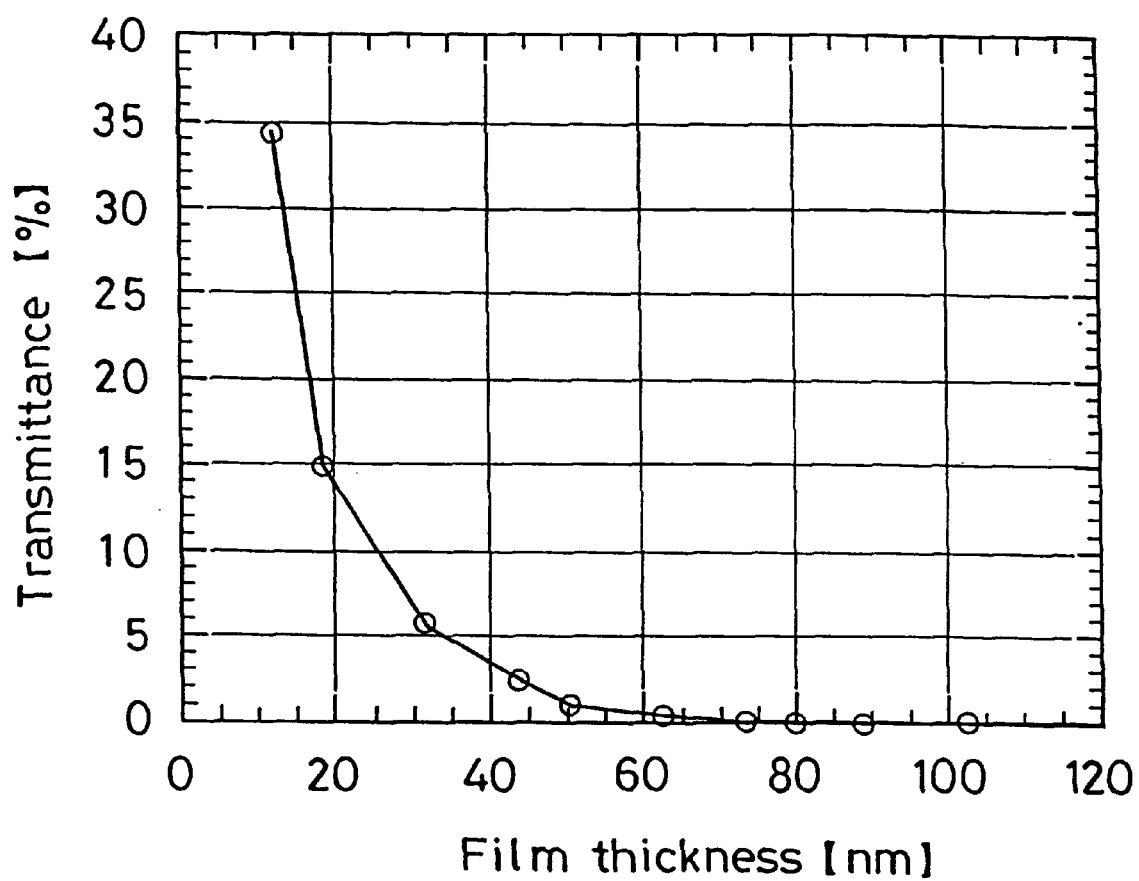
FIG. 15 is a graph showing the relationship between the thickness and transmittance of a chromium film used as a light-blocking film.

Finally, the resist 1305 was lifted off to remove the second light-blocking film 1307 from the device pattern area, thereby obtaining a phase shift mask 1308 according to the present invention, as shown in FIG. 14(g).

Although the phase shift mask according to the present invention has been described above by way of some examples, it should be noted that the present invention is not necessarily limited to the described examples, and that various modifications may be imparted thereto.

As will be clear from the foregoing description, in the present invention, at least one layer constituting a halftone phase shift film consists essentially of a compound of at least one metallic element and at least one element selected from the group consisting of oxygen, fluorine, carbon, nitrogen, and chlorine, and the content of the at least one element selected from among oxygen, fluorine, carbon, nitrogen, and chlorine in the compound in a region where the transmittance is be to reduced is made different from that in another region on the transparent substrate. By simply doing so, it is possible to readily obtain a halftone phase shift mask which need not to form an ultra-fine pattern and is capable of suppressing during exposure the occurrence of a sub-peak of light intensity, which has an adverse effect on the image formation, and which has a light-blocking frame with a reduced transmittance at a region outside a device pattern area which corresponds to a region subjected to multiple exposure during transfer effected by using the mask.

Another halftone phase shift mask and production method therefore according to the present invention make it possible to readily obtain a halftone phase shift mask which need not to form an ultra-fine pattern and is capable of suppressing during exposure the occurrence of a sub-peak of light intensity, which has an adverse effect on the image formation, and which has a light-blocking frame with a reduced transmittance at a region outside a device pattern area which corresponds to a region subjected to multiple exposure during transfer effected by using the mask, simply by forming an exposure light-blocking pattern of an ultra-fine particle film in a necessary region on a transparent substrate.

A phase shift mask according to the present invention has at least a light-blocking film provided on a transparent substrate to form a first pattern, and a phase shift film stacked on the light-blocking film, after the light-blocking film has been patterned, to form a second pattern. The phase shift mask is characterized in that the light-blocking film has a relatively large thickness in a region on the transparent substrate and a relatively small thickness in another region on the transparent substrate, or that the light-blocking film is a multi-layer film comprising a plurality of layers, and that the multi-layer film has a relatively large number of layers in a region on the transparent substrate, and it has a relatively small number of layers in another region on the transparent substrate. Thus, in a region where a phase shift effect is required, it is possible to minimize thickness variations of the phase shift film due to steps in the patterned light-blocking film, and in a region where a satisfactorily high opacity is required, the mask exhibits satisfactory light-blocking characteristics. Accordingly, a superior phase shift effect can be drawn out from an overlying shifter type phase shift mask.

What we claim is:

1. A phase shift mask having at least a first pattern of a light-blocking film on a transparent substrate, and a second pattern of a phase shift film stacked over said first pattern, wherein said light-blocking film has a relatively large thickness in a region where a satisfactory high opacity is required, and a relatively small thickness in a region where a phase shift is required.

2. A phase shift mask according to claim 1, wherein said region in which said light-blocking film has a relatively large thickness includes a region corresponding to a region subjected to multiple exposure during transfer effected by using said phase shift mask.

* * * * *